United States Patent [19]

Wang

[11] Patent Number: 5,619,155
[45] Date of Patent: Apr. 8, 1997

[54] IC-CHIP OPERATION INHIBITOR

[75] Inventor: Song-Tine Wang, Hsinchu Hsien, Taiwan

[73] Assignee: United Microelectronics Corporation, Hsinchu, Taiwan

[21] Appl. No.: 460,225

[22] Filed: Jun. 2, 1995

[51] Int. Cl.⁶ .......................... H03K 17/20; H03K 7/00
[52] U.S. Cl. .......................... 327/142; 327/198; 327/42
[58] Field of Search .......................... 327/39, 40, 42, 327/44, 47, 48, 144, 145, 142, 198, 20, 141, 99

[56] References Cited

U.S. PATENT DOCUMENTS

| | | | |
|---|---|---|---|
| 4,024,414 | 5/1977 | Gurry | 327/45 |
| 4,886,983 | 12/1989 | Taka | 327/142 |
| 5,371,417 | 12/1994 | Mirov et al. | 327/142 |

*Primary Examiner*—Timothy P. Callahan
*Assistant Examiner*—Dinh T. Le
*Attorney, Agent, or Firm*—Cushman Darby & Cushman, IP Group of Pillsbury Madison & Sutro, LLP

[57] ABSTRACT

An IC chip operation inhibitor to prevent operation of an IC chip in a system having a clock rate that exceeds a predetermined reference clock rate for the chip. The inhibitor has a frequency detecting device that generates at least one reference frequency. It compares the system clock with the reference frequency and prevents the chip from operating if the system clock frequency is greater than the reference frequency. The invention includes an external actuating device coupled to the frequency detecting device for generating a compare enable signal to actuate the comparing function of the frequency detecting device, and for generating a frequency select signal for selecting one of the built-in reference frequencies to be compared with the system oscillating frequency. The external actuating device may be turned off in order not to actuate the comparing function of the frequency detecting device when it is sure that the system oscillating frequency will not be higher than the reference frequency.

25 Claims, 2 Drawing Sheets

IC-CHIP OPERATION INHIBITOR

BACKGROUND OF THE INVENTION

1. Field of the Invention

The present invention relates to an arrangement for inhibiting the operation of an integrated circuit chip. More specifically, the invention provides an arrangement for preventing an IC chip from being operated in a system having a clock rate that is greater than a predetermined frequency.

Even more specifically, the invention is directed to an arrangement for detecting the clock rate of a system in which the chip is operating and comparing it to an on chip generated reference frequency which defines that maximum frequency at which the chip is to be operated. If the system clock rate exceeds the reference frequency, operation of the chip is prevented.

2. Description of Related Art

Integrated circuit (IC) chips are designed to operate in specific environments under predetermined operating conditions. These conditions may include operating frequency (clock rate), supply voltage ($V_{cc}$), ambient temperature (TA), AC and DC conditions, etc. The chip must be operated within the ranges specified for that chip to assure that it will properly operate. Some ICs, however, may operate at a frequency greater than that for which they were designed even though their accuracy may be less than intended.

Marketing constraints and special customer requirements for IC chips may dictate that IC chip manufactured for a high specification, for example a high clock rate, may be sold to a customer who intends to operate the chip at a lower specification than that for which it was designed. For example, a customer needing a 33 MHz. clock rate chip may be sold a 50 MHz. clock rate chip. In other words, a higher specification chip may be sold as a lower specification chip. Such a situation does not cause a problem. However, the reverse situation does cause a problem.

Some unscrupulous merchants may buy ICs having a low specification at a low price, and then represent it as being a higher specification chip and sell it for a higher price than that for which it should be sold. Such a merchant may actually alter a label on the chip or otherwise mark it to indicate a higher specification that should be indicated to obtain unfair profits. This can greatly damage the reputation of the chip manufacturer and cause considerable market disruptions.

This problem frequently occurs in the CPU (Central Processing Unit) IC market. For example, the operating frequency for the CPU of an IBM compatible personal computer is often 33 MHz. or 40 MHz. Some merchants may buy a 33 MHz. CPU at a low price, re-mark it as a 40 Mhz. or higher CPU and sell it at a higher price.

So far, there have been essentially three approaches taken to solve this problem:

(1) IC manufacturers sell their products only to credible wholesale dealers or customers. Unfortunately, this approach does not control sales downstream (the aftermarket). There may be a long chain of resellers, any one of whom may remark the chip and attempt to "upgrade" it.

2) Reduce the safe operating range of IC products. This approach in general degrades the overall chip market. There is demand among certain users for the most powerful, high specification chips available. Those chips must be distinguished from the lower specification chips on the market.

(3) Replace the conventional printed label on IC products by laser optical label that is harder to modify. This approach is also ineffective. Even though the label is harder to modify, it can still be modified. Furthermore, making extremely difficult to modify labels is quite expensive and raises the cost of the IC chips for everyone.

SUMMARY OF THE INVENTION

The primary object of the present invention is to provide a way to prevent the improper upgrading of an IC chip to a higher performance standard than that for which it was designed.

The invention achieves this objective by providing circuitry in the chip that prevents it from being operated at a clock rate greater than that for which it was designed. The arrangement provided by the invention includes an on-board reference frequency generator and means for comparing the system clock frequency to the on-board generated reference frequency. If there is a prohibited mismatch according to predetermined criteria, the chip is electronically inhibited from operating. A merchant who cannot get his chip to operate at a higher than rated speed is less likely to pass off the chip as being of a higher specification than it actually is.

For example, assume that a CPU is to be "protected" by the invention. Further assume that the CPU has been designed to operate in a system having a clock rate of 33 MHz. If the CPU is plugged into a system which has a 33 MHz. clock, the invention compares the system clock to an on-board generated reference frequency of 33 Mhz. and notes that there is no problem. Operation of the chip is not interfered with in any way. However, if the CPU is plugged into a system having a 40 MHz. clock, the invention compares the system clock with the on-board generated 33 Mhz. reference frequency and determines that there is an attempt to operate the chip at a higher performance specification than designed for. It will automatically prevent operation of the chip.

The concept of the invention is extendible to chips and systems designed to operate at multiple clock rates depending on their mode of operation. For example, a CPU may be designed to be operated at either 33 or 50 MHz. The invention provides a frequency detecting arrangement that can be used to detect multiple clock rates.

More specifically, the present invention provides within the chip, a means for generating a reference frequency signal, a means for comparing the reference frequency to the system clock, and a means for inhibiting operation of the chip when the system clock rate is greater than that of the reference frequency.

An actuating device generates a compare enable signal. When the compare enable signal is present, a frequency detector having at least one internal reference frequency source and which is coupled to the actuating device, compares the system clock frequency with the reference frequency. Chip operation is disabled when the system clock frequency is greater than the reference frequency. The chip is permitted to operate normally when the frequency of the system clock frequency signal is not higher than the reference frequency generated on-board the chip.

In accordance with one aspect of the present invention, the actuating device may be turned off in so as to not actuate the comparing function of the frequency detecting means when it is certain that the frequency of the system clock will not be higher than the reference frequency. The frequency detecting means may include means for generating a plurality of reference frequencies. In such a case, the actuating device is made capable of generating a frequency select signal for selecting one of the reference frequencies as the predetermined frequency for comparison with the system clock frequency.

In a preferred embodiment of the invention, the frequency detecting means includes a first counter for receiving a signal based on the system clock and converting it into a first pattern output signal. The actuating device provides a signal causing an oscillator to generate a pulse signal at the predetermined reference frequency. A second counter, coupled to the oscillator, converts the reference frequency pulse signal into a second pattern output signal. A pattern recognizer, coupled to the first and second counters, compares the first and second pattern output signals to determine whether to inhibit operation of the chip.

The first and second counters are preferably down counters with the same preset count. The pattern recognizer is preferably a flip-flop with latch function. The pattern recognizer disables the application of the system clock to the chip to shut it down when the frequency of the system clock is higher than the reference frequency. The frequency detecting means may further include a reset circuit for generating a set signal to set the first and second down counters, and a reset signal to reset the pattern recognizer when the system is initially turned on.

The oscillator is controlled by the frequency select signal to generate the reference frequency pulse signal at the predetermined built-in reference frequency.

The present invention provides a frequency detector for a chip which is operated by a system clock signal. The frequency detector comprises a frequency detecting means including means for generating at least one reference frequency. It compares the system clock frequency with the reference frequency and shuts down the chip when the system clock frequency is higher than the reference frequency. It permits the chip to operate normally when the frequency of the system clock is not higher than the reference frequency.

In accordance with the present invention there is provided a frequency detector for any IC device which is operated at a system clock frequency. It comprises an actuating device for generating a compare enable signal and a frequency detecting means. The frequency detecting means includes means for generating at least one reference frequency and is coupled to the actuating device. The frequency detecting means compares the system clock frequency with the reference frequency, when being actuated by the compare enable signal and shuts down the product when the system clock frequency is higher than the reference frequency. It permits the product to work normally when the system clock frequency is not higher than the reference frequency.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

Figure 1:
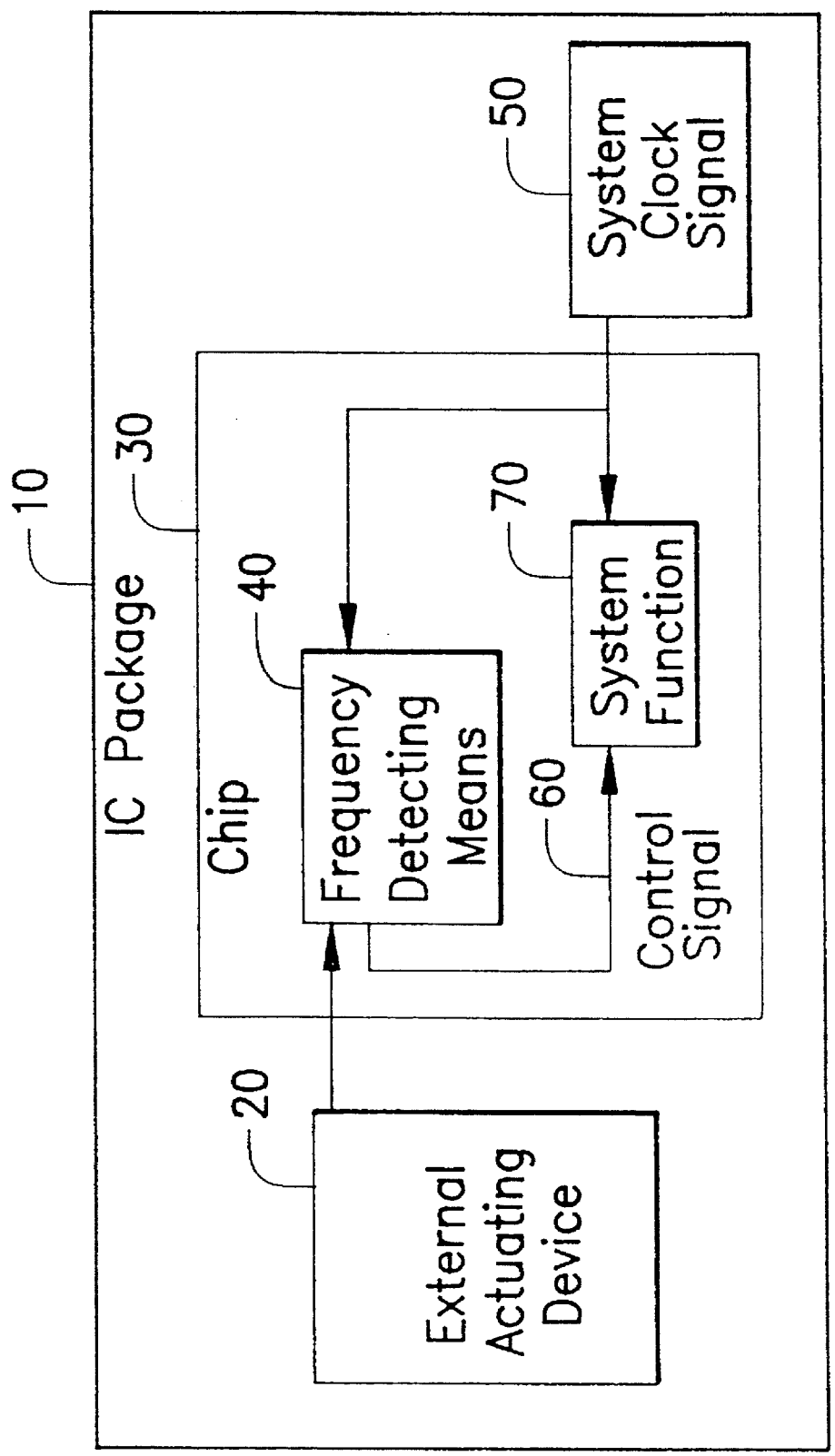
FIG. 1 is a schematic block diagram of an IC chip operation inhibitor according to a preferred embodiment of the invention.

FIG. 1 is a schematic block diagram of an IC chip operation inhibitor according to a preferred embodiment of the invention. A chip 30, whose operation is to be controlled, is packaged in an IC package 10, along with an external actuating device 20. Chip 30 is operated by a system clock signal 50 that comes from the system into which chip 30 is placed for operation. Chip 30 has an integrated frequency detecting means 40 having one or more built-in reference frequency source, which may have the ability to generate various predetermined reference frequencies from one or more reference clocks. The external actuating device 20 provides a signal to frequency detecting means 40 to actuate it The signal from external actuating device 20 may indicate to frequency detecting means 40 which of a plurality of available reference frequencies to use as a predetermined frequency against which to compare the system clock signal 50. When actuated by external actuating device 20, the frequency detecting means 40 compares the system clock signal 50 with the predetermined reference frequency and generates a control signal 60. Control signal 60 enables or disables the system function 70 depending upon the comparison result of frequency detecting means 40.

If the IC chip is sold in accordance with its originally designed frequency specification, the IC manufacturer can permanently turn off the external actuating device 20, for example by disconnecting the power connection of the external actuating device 20 or by disconnecting the frequency detecting means 40 from the external actuating device 20. In this manner, the frequency detecting means 40 will not be actuated, and thus the execution of the system function 70 will not be affected by the frequency detecting means 40. It should be understood that the turn-off of the external actuating device 20 can be done anytime after the chip is manufactured and before it is delivered to the original customer.

If the IC chip is sold under a specification lower than the originally designed frequency specification, the external actuating device 20 can be turned on, before delivery, to actuate frequency detecting means 40. Whenever the chip 30 is used to operate at a higher frequency than the frequency specification at which it was originally sold, the frequency detecting means 40 will generate control signal 60 to interrupt the execution of the system function 70.

Figure 2:
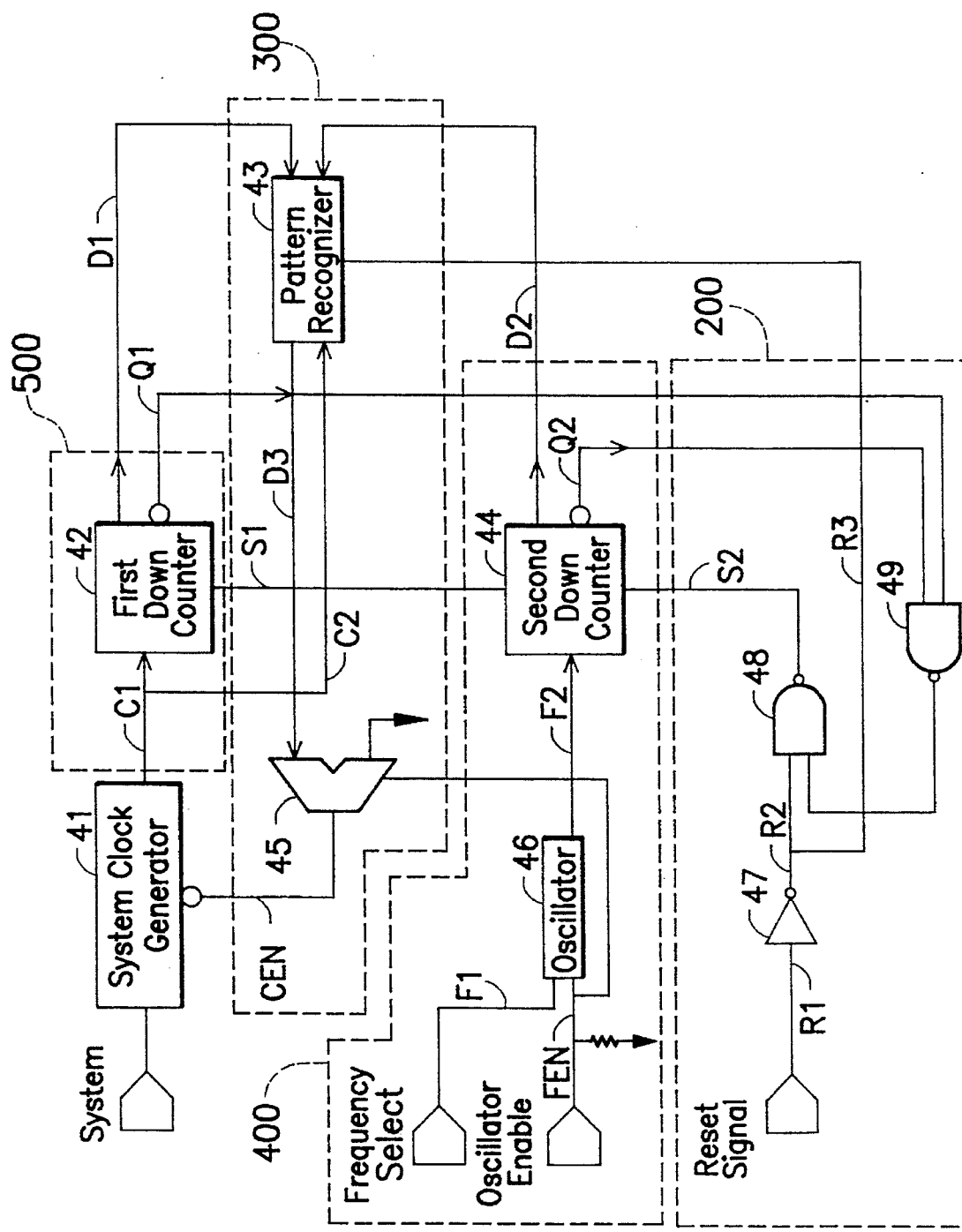
FIG. 2 is a schematic diagram of a frequency detector which may be used in the on-chip frequency detector of FIG. 1.

Referring to FIG. 2, there is shown in more detail, a frequency detector that can be used as frequency detecting means 40 shown in FIG. 1. Frequency detecting means 40 includes a system oscillating frequency circuit 500, a reference frequency circuit 400, a comparing circuit 300, and a reset circuit 200. The system oscillating frequency circuit 500 includes a first down counter 42 coupled to a system clock generator 41 of the system via a line C1 so as to receive the system clock pulse signal. The first down counter 42, in turn, sends a first pattern via a line D1 to a pattern recognizer 43 of comparing circuit 300. The operations of the first down counter 42 are listed in the following truth table 1.

TABLE 1

"CLK" means triggering pulse; "Set" means set signal;
"X" means "don't care"; and the preset count number = N.
Truth Table for Down Counter 42, 44

| Inputs | Output "Q" at D1/D2 | Reversed Output "Q̄" |
|---|---|---|
| Set = "1" | 1 | 0 |
| Counting Number < N; and CLK = "X" | 1 | 0 |

TABLE 1-continued

"CLK" means triggering pulse; "Set" means set signal;
"X" means "don't care"; and the preset count number = N.
Truth Table for Down Counter 42, 44

| Inputs | Output " Q " at D1/D2 | Reversed Output " Q̄" |
|---|---|---|
| Counting Number = N; and CLK = "Trigger" | 0 | 1 |

The reference frequency circuit 400 includes an oscillator 46 coupled to the external actuating device 20 (FIG. 1), and a second down counter 44 coupled to receive reference frequency F2 from oscillator 46. Oscillator 46 receives a frequency select signal F1, and an oscillator enable signal FEN, both from external actuating device 20. The frequency select signal FI is used to select one of the built-in reference frequencies as the predetermined reference frequency F2, against which comparisons will be made. The oscillator enable signal FEN is used to actuate the oscillator 46 to send a pulse signal of the predetermined reference frequency F2 to the second down counter 44. The second down counter 44, in turn, sends a second pattern D2 to pattern recognizer 43 of comparing circuit 300. The operations of the second down counter 44 are similar to those of the first down counter 42, as set forth in truth table 1, above. The structures, stage numbers, and count numbers of the first down counter 42 and second down counter 44 are the same.

The pattern recognizer 43 of comparing circuit 300 receives a pattern from first down counter 42 via D1 and a pattern from second down counter 44 via D2. Pattern recognizer 43 provides a signal to a multiplexer 45 via D3, which is also coupled to the clock low enable input CEN of system clock generator 41.

The pattern recognizer 43 may be constituted by a flip-flop having a latch function. The operations of the pattern recognizer 43 are detailed in the following truth table 2.

TABLE 2

"X" means "don't care".
Truth Table for Pattern Recognizer 43

| First Pattern | Second Pattern | Reset Signal | Output "Q" |
|---|---|---|---|
| X | X | 1 | 0 |
| 1 | 1 | 0 | 0 |
| 1 | 0 | 0 | 0 |
| 0 | 1 | 0 | 1 (latched till reset signal = "1") |
| 0 | 0 | 0 | Q |

When the first and second patterns are received, the pattern recognizer 43 performs the following comparing functions:

(1) If the system oscillating frequency is higher than the predetermined reference frequency, the first pattern turns from "1" to "0" because the counting speed of the first down counter 42 is higher than that of the second down counter 44. When this happens, the pattern recognizer 43 generates a control signal "1" at its output terminal Q, according to the above truth table 2. The control signal "1" is sent to a clock low enable input CEN of the system clock generator 41 via a connection line D3 and the multiplexer 45. This causes the system clock generator 41 to continuously output a "1". The operations of the system clock generator 41 are listed in the following truth table 3. Consequently, the system is shut down because there is no system clock signal. The control signal "1" of the pattern recognizer 43 is latched until a reset signal is received by the pattern recognizer 43.

TABLE 3

"CEN" means "clock enable" signal.
Truth Table for System Clock Generator 41

| "CEN" = "0" | Output = "System Clock" |
|---|---|
| "CEN" = "1" | Output = "1" |

(2) If the system oscillating frequency is lower than the predetermined reference frequency, the second pattern turns from "1" to "0" because the counting speed of the first down counter 42 is lower than that of the second down counter 44. When this happens, the pattern recognizer 43 generates a control signal "0" (which will not be latched) at its Q output, according to the above truth table 2. The control signal "0" is sent to the clock low enable input CEN of the system clock generator 41 via the connection line D3 and the multiplexer 45, thereby permitting the system clock generator 41 to output the system clock, according to the above truth table 3. Consequently, the system functions normally.

(3) If the system oscillating frequency equals the predetermined reference frequency, the first and second patterns turn from "1" to "0" simultaneously. In such a condition, the output of the pattern recognizer 43 remains at the previous state, i.e. signal "0". The system also functions normally.

The reset circuit 200 includes an inverter 47, a NAND gate 48. NAND gate 48 has one input terminal coupled to the output terminal of the inverter 47 via R2 and its output terminal coupled to the set terminals of the first and second down counters 42 and 44, via lines S2 and S1, respectively. Another NAND gate 49 has its input terminals coupled to the reversed output terminals of the first and second down counters 42 and 44 via connection lines Q1 and Q2, respectively, and its output terminal coupled to another input terminal of the NAND gate 48. The output terminal of the inverter 47 is further coupled via R3 to the reset terminal of the pattern recognizer 43. When the system is turned on, a reset signal="1" presents at a reset signal terminal which is coupled to the input terminal of the inverter 47 via a connection line R1. The output signal "0" of the inverter 47 will reset the pattern recognizer 43 via a connection line R3, according to the above truth table 2. In this state, the output of the NAND gate 48 is at "1" to set the first and second down counters 42 and 44 via lines S1 and S2, respectively, according to the above truth table 1.

The selecting of the reference frequencies and the operating conditions of the on-chip frequency detector are explained by use of the following example:

Suppose the frequency specification of the chip 30 is 40 MHz, and the chip is sold with a 33 MHz specification at a lower price for some reasons. The IC manufacturer can select the operating conditions of the on-chip frequency detector according to the following procedure:

(1) Four reference frequencies 30, 32, 34 and 36 MHz are built in the frequency detecting means 40.

(2) The operating conditions for the above frequency specification are $V_{cc}$=4.5 Volt, and T(P/N)=100° C.

(3) The counter stage number of the frequency detecting means 40 can be used to determine the detecting sensitivity. Suppose the detecting sensitivity is 2.5%, the highest reference frequency which is still distinguishable from the 40 MHz system clock input is 39 MHZ, and the lowest reference frequency which will not erroneously shut down the system operation is 34 MHz.

(4) If the process variation of the chip is from −5% to 10%, one of the four reference frequencies can be adequately selected as the predetermined reference frequency, according to the process variation rates and the operating temperature ranges listed in Table 4, in order to assure the accurate operation of the on-chip frequency detector. This means that the provision of multiple built-in reference frequencies can facilitate the balance of process variation effects.

TABLE 4

Vcc = 4.5 Volt, T(P/N) = 100° C. (Reference Frequency 34 ~ 39 MHz)

| Process Variation | | −5% | 0% | 5% | 10% |
|---|---|---|---|---|---|
| Reference Frequency | (1) 30 MHz | | | | 45 ~ 95° C. |
| | (2) 32 MHz | | | 50 ~ 100° C. | |
| | (3) 34 MHz | | 50 ~ 100° C. | | |
| | (4) 36 MHz | 50 ~ 100° C. | | | |

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A frequency detector for an integrated circuit chip, comprising:

an actuating device for generating a compare enable signal;

a system oscillating frequency circuit for generating a system frequency for operating the chip;

a reference frequency circuit for generating a reference frequency;

a comparing circuit for comparing the system frequency and the reference frequency when actuated by the compare enable signal then shutting down the chip when the system frequency is higher than the reference frequency; and a reset circuit for setting the system oscillating frequency circuit and reference frequency circuit, and resetting the comparing circuit.

2. A frequency detector as claimed in claim 1, wherein the actuating device is outside the chip.

3. A frequency detector as claimed in claim 2, further comprising means for de-activating the actuating device so as to not actuate the comparing circuit when the system frequency is not higher than the reference frequency.

4. A frequency detector as claimed in claim 3, wherein the reference frequency circuit generates a plurality of reference frequencies, and the actuating device generates a frequency select signal for selecting one of the reference frequencies as a predetermined reference frequency to be compared with the system frequency.

5. A frequency detector for an integrated circuit chip which is operated by a system clock having a system frequency, comprising:

an actuating device for generating a compare enable signal;

a first counter for receiving the system clock signal and converting it into a first pattern output signal;

an oscillator coupled to the actuating device for being actuated by the compare enable signal to generate a reference frequency pulse signal at a predetermined frequency;

a second counter coupled to the oscillator for converting the reference frequency pulse into a second pattern output signal;

a pattern recognizer, coupled to the first and second pattern output signals, for shutting down the chip when the first pattern output signal is different from the second pattern output signal in a predetermined manner; and a reset circuit for setting the first counter and second counter, and resetting the pattern recognizer.

6. A frequency detector as claimed in claim 5, wherein the first and second counters are down counters having the same preset count.

7. A frequency detector as claimed in claim 6, wherein the pattern recognizer disables the system clock in order to shut down the chip when the frequency of the system frequency signal is higher than the reference frequency.

8. A frequency detector as claimed in claim 7, wherein the pattern recognizer comprises a flip-flop having a latch function.

9. A frequency detector as claimed in claim 8, wherein the reset circuit generates a set signal to set the first and second down counters and a reset signal to reset the pattern recognizer when the system is initially turned on.

10. A frequency detector for an integrated circuit chip which is operated by a system clock having a system frequency, comprising:

an external actuating device for generating a compare enable signal and a frequency select signal;

a first counter for receiving the system clock and converting it into a first pattern output signal;

an oscillator for generating a plurality, of reference frequencies, the oscillator being actuated by the frequency select signal and the compare enable signal for selecting one of the reference frequencies as a predetermined reference frequency to be compared with the system frequency;

a second counter coupled to the oscillator for converting the reference frequency pulse signal into a second pattern output signal;

a pattern recognizer coupled to the first and second counter for comparing the first and second pattern output signals for shutting down the chip when the first pattern output signal is different from the second pattern output signal in a predetermined manner; and a reset circuit for setting the first counter and second counter, and resetting the pattern recognizer.

11. A frequency detector as claimed in claim 10, wherein the first and second counters are down counters with a same preset count, and wherein the pattern recognizer is a flip-flop having a latch function.

12. A frequency detector as claimed in claim 11, wherein the flip-flop disables, using its latch function, the system oscillating frequency signal in order to shut down the chip when the frequency of the system oscillating frequency signal is higher than the reference frequency.

13. A frequency detector as claimed in claim 12, wherein the reset circuit generates a set signal to set the first and second down counters and a reset signal to reset the flip-flop when the system is initially turned on.

14. A frequency detector for an integrated circuit chip, comprising:

a reference frequency circuit for generating a reference frequency;

a system oscillating frequency circuit for generating a system frequency to have the chip be operated.;

a comparing circuit for comparing the system frequency and the reference frequency, then shutting down the chip when the system oscillating frequency is higher than the reference frequency; and a reset circuit, for setting the system oscillating frequency circuit and the reference frequency circuit, and resetting the comparing circuit.

15. A frequency detector as claimed in claim 14, further comprising an actuating device mounted outside the chip for generating a compare enable signal to actuate the comparing circuit.

16. A frequency detector as claimed in claim 15, wherein reference frequency circuit, the comparing circuit and the reset circuit are mounted in the chip.

17. A frequency detector as claimed in claim 16, further comprising means for de-activating the actuating device so as to not actuate the comparing circuit when the system frequency is not higher than the reference frequency.

18. A frequency detector as claimed in claim 17, wherein the reference frequency circuit generates a plurality of reference frequencies, and wherein the actuating device generates a frequency select signal for selecting one of the reference frequencies as a predetermined reference frequency to be compared with the system frequency of the system clock.

19. A frequency detector for a chip which is operated by a system clock having a system frequency, comprising:

a first counter for receiving the system clock signal and converting it into a first pattern output signal;

an oscillator for generating a reference frequency pulse signal at the predetermined frequency;

a second counter coupled to the oscillator for converting the reference frequency pulse into a second pattern output signal;

a pattern recognizer coupled to the first and second pattern output signals for shutting down the chip when the first pattern output signal is different from the second pattern output signal in a predetermined manner; and a reset circuit for setting the first counter and second counter, and resetting the pattern recognizer.

20. A frequency detector as claimed in claim 19, wherein the first and second counters are down counters having the same preset count.

21. A frequency detector as claimed in claim 20, wherein the pattern recognizer disables the system clock signal in order to shut down the chip when the frequency of the system clock is higher than the reference frequency.

22. A frequency detector as claimed in claim 21, wherein the pattern recognizer is a flip-flop having a latch function.

23. A frequency detector as claimed in claim 22, further comprising a reset circuit for generating a set signal to set the first and second down counters, and a reset signal to reset the pattern recognizer when the system is initially turned on.

24. A frequency detector as claimed in claim 19, further comprising an actuating device mounted outside the chip for generating a compare enable signal to actuate the comparing circuit.

25. A frequency detector as claimed in claim 24, wherein the oscillator generates a plurality of reference frequencies, and wherein the actuating device generates a frequency select signal for selecting one of the reference frequencies as a predetermined reference frequency to be compared with the system frequency of the system clock.

\* \* \* \* \*